United States Patent
Fang et al.

(10) Patent No.: US 11,704,630 B2
(45) Date of Patent: Jul. 18, 2023

(54) LAMP, LAMP FAN LIFE PREDICTING SYSTEM AND METHOD THEREOF

(71) Applicant: Current Lighting Solutions, LLC, East Cleveland, OH (US)

(72) Inventors: Min Fang, Shanghai (CN); Zhu Mao, Shanghai (CN); Yong Li, Shanghai (CN); Qi Long, Shanghai (CN); Shuyi Qin, Shanghai (CN)

(73) Assignee: CURRENT LIGHTING SOLUTIONS, LLC, Beachwood, OH (US)

( * ) Notice: Subject to any disclaimer, the term of this patent is extended or adjusted under 35 U.S.C. 154(b) by 528 days.

(21) Appl. No.: 16/214,171

(22) Filed: Dec. 10, 2018

(65) Prior Publication Data

US 2019/0213562 A1    Jul. 11, 2019

(30) Foreign Application Priority Data

Jan. 5, 2018   (CN) .......................... 201810010204.1

(51) Int. Cl.
*F21V 29/60* (2015.01)
*G06Q 10/20* (2023.01)
(Continued)

(52) U.S. Cl.
CPC ............... *G06Q 10/20* (2013.01); *G01K 3/10* (2013.01); *G01P 3/00* (2013.01); *G01R 19/0092* (2013.01); *F21V 29/60* (2015.01)

(58) Field of Classification Search
CPC ....................................................... G06Q 10/20
(Continued)

(56) References Cited

U.S. PATENT DOCUMENTS

| | | |
|---|---|---|
| 7,142,125 B2 | 11/2006 | Larson et al. |
| 7,565,267 B2 | 7/2009 | Warizaya |

(Continued)

FOREIGN PATENT DOCUMENTS

| | | |
|---|---|---|
| CN | 101074966 A | 11/2007 |
| CN | 102758787 A | 10/2012 |

(Continued)

OTHER PUBLICATIONS

Office Action Issued in connection with corresponding Chinese Application No. 201810010204.1 dated Apr. 10, 2020.

*Primary Examiner* — Ricky Go
(74) *Attorney, Agent, or Firm* — Buckley, Maschoff & Talwalkar LLC

(57) ABSTRACT

The disclosure relates to a life prediction system for a fan of a lamp. The system comprises a fan signal detecting module to detect at least one working parameter of the fan; and a micro control unit to receive the working current signal, the environment temperature signal and the working rotation speed signal of the fan. The detecting module comprises a current detecting unit to detect a working current of the fan and output a working current signal; a temperature detecting unit to detect a working environment temperature of the fan and output an environment temperature signal; and a rotation speed detecting unit to detect and output a working rotation speed signal of the fan. The micro control unit calculates a predicted residual life of the fan based on the received working current signal, the environment temperature signal, the working rotation speed signal, through the life model of the fan.

7 Claims, 8 Drawing Sheets

(51) Int. Cl.
*G01K 3/10* (2006.01)
*G01P 3/00* (2006.01)
*G01R 19/00* (2006.01)

(58) Field of Classification Search
USPC .......................................................... 702/34
See application file for complete search history.

(56) References Cited

U.S. PATENT DOCUMENTS

| | | |
|---|---|---|
| 10,077,780 B2 | 9/2018 | Tsai |
| 2005/0174780 A1* | 8/2005 | Park ...................... F21V 29/506 |
| | | 362/294 |
| 2006/0176186 A1* | 8/2006 | Larson ..................... H02H 7/08 |
| | | 324/177 |
| 2007/0153443 A1* | 7/2007 | Lyons ................. F04D 27/001 |
| | | 361/103 |
| 2009/0063057 A1 | 3/2009 | Miettinen |
| 2010/0070210 A1* | 3/2010 | Urmanov ............ G06F 11/3058 |
| | | 702/56 |
| 2011/0042056 A1* | 2/2011 | Bae ......................... F21V 29/54 |
| | | 165/104.34 |
| 2011/0075433 A1* | 3/2011 | Mart ....................... F21V 21/30 |
| | | 362/427 |
| 2011/0125418 A1* | 5/2011 | Wang .................... F04D 27/001 |
| | | 702/34 |
| 2011/0248614 A1* | 10/2011 | Wang .................... F21V 29/677 |
| | | 313/46 |
| 2012/0080699 A1* | 4/2012 | Chowdhury ............ F21K 9/232 |
| | | 165/185 |
| 2012/0215509 A1* | 8/2012 | Callot ................ G05B 23/0243 |
| | | 702/34 |
| 2013/0112367 A1 | 5/2013 | Kooken et al. |
| 2016/0132050 A1* | 5/2016 | Heller ....................... H02P 6/12 |
| | | 702/34 |
| 2017/0091672 A1 | 3/2017 | Sasaki |
| 2017/0219234 A1* | 8/2017 | Bhide ....................... H02J 9/06 |
| 2018/0373300 A1* | 12/2018 | Bhatia .................... G06F 1/206 |

FOREIGN PATENT DOCUMENTS

| | | |
|---|---|---|
| CN | 103470521 B | 12/2013 |
| CN | 104728149 A | 6/2015 |
| CN | 104964186 A * | 10/2015 |
| CN | 105359045 A | 2/2016 |
| CN | 106961236 A | 7/2017 |
| CN | 107526922 A | 12/2017 |
| JP | 2005004675 A | 1/2005 |
| JP | 2010129258 A | 6/2010 |
| JP | 2010153343 A | 7/2010 |
| JP | 2015031667 A | 2/2015 |

\* cited by examiner

LAMP, LAMP FAN LIFE PREDICTING SYSTEM AND METHOD THEREOF

TECHNICAL FIELD

The present application relates to a life prediction system for a fan and method thereof, and more particularly to a life prediction system for a fan of a lamp and method thereof, and a lamp to which the fan life prediction system is applied.

BACKGROUND

As a new-generation light source, an LED has the advantages of energy saving, environmental protection, long life, diversified colors, stable beam, and high electro-optical conversion rate. It has become a trend to use the LED as a lighting source in recent years.

In some applications where the light intensity is high, due to the large amount of thermal energy generated by the high-power LED light-emitting components and the relatively harsh external environment that may exist, the internal temperature of the LED lamp may become too high, which will in turn affect the service life of the LED light-emitting components and other electronic components. Therefore, fans are commonly installed inside these LED lamps to maintain the internal temperature of the LED lamps within a normal temperature range. However, during the use of the lamps, the wear and tear caused by the high load of the fan, the evaporation and oxidation of the lubricant in the fan caused by the high temperature because of the closed environment, and the wear and tear to the fan caused by the dust in the environment, which will all lead to a decrease in the service life of the fan, thereby reducing the service life of the entire lamp. Since the service life of the fan is generally shorter than the service life of other electronic components of the LED lamp, in general, the fan must be replaced during the use of the LED lamp to ensure its normal operation.

In general, there are two strategies for fan replacement. One strategy is to periodically replace the fan, regardless of its actual operational condition. This may result in the replacement of a well-functioning fan and leading to waste, or it may result in a failure due to the fact that some fans having malfunctioned before reaching the end of their service life, thereby posing a safety hazard to the use of the entire system. Another strategy is to activate an alarm when the system temperature is detected to exceed the normal range, and then repair or replace the fan; however, at such a time, the system is likely to have been damaged due to the rise in temperature.

Therefore, it is necessary to provide a life prediction system for a fan of a lamp and a method thereof to solve the technical problems above.

SUMMARY

One aspect of the present application is to provide a life prediction system for a fan of a lamp, comprising: a fan signal detecting module and a micro control unit. A fan signal detecting module configured to detect at least one working parameter of the fan, comprising: a current detecting unit configured to detect a working current of the fan and output a working current signal; a temperature detecting unit configured to detect a working environment temperature of the fan and output an environment temperature signal; and a rotation speed detecting unit configured to detect and output a working rotation speed signal of the fan. A micro control unit is configured to receive the working current signal, the environment temperature signal and the working rotation speed signal of the fan, with the micro control unit comprising a storage unit configured to store a life model of the fan. Wherein, the micro control unit is configured to calculate a predicted residual life of the fan based on the working current signal, the environment temperature signal, the working rotation speed signal and the life model.

Another aspect of the present application is to provide a method for predicting the life for a fan of a lamp, comprising: detecting a working current of the fan and outputting a working current signal; detecting a working environment temperature of the fan and outputting an environment temperature signal; detecting and outputting a working rotation speed signal of the fan; and receiving the working current signal, the environment temperature signal and the working rotation speed signal and calculating a predicted residual life of the fan based on a life model of the fan.

Yet another aspect of the present application is to provide a lamp, comprising a fan and a fan signal detecting module configured to detect at least one working parameter of the fan. The fan signal detecting module comprising: a current detecting unit configured to detect a working current of the fan and output a working current signal; a temperature detecting unit configured to detect a working environment temperature of the fan and output an environment temperature signal; and a rotation speed detecting unit configured to detect and output a working rotation speed signal of the fan. Wherein, the working current signal, the environment temperature signal and the working rotation speed signal of the fan are to be received at a micro control unit, comprising a storage unit configured to store a life model of the fan. The micro control unit is configured to calculate a predicted residual life of the fan based on the working current signal, the environment temperature signal, the working rotation speed signal and the life model.

One of the purposes of the present application is to design a life prediction system for a fan of a lamp to predict the residual life of the fan, so that effective measures can be taken in a timely manner to avoid damage to the entire lamp system due to fan failure.

BRIEF DESCRIPTION OF DRAWINGS

Embodiments of the present application are described with reference to the accompanying drawings, so that the present invention can be better understood. In the accompanying drawings.

DETAILED DESCRIPTION OF EMBODIMENTS

Unless defined otherwise, the technical terms or scientific terms used herein should have ordinary meanings construed by those of ordinary skill in the art to which the present application belongs. The "first", "second" and similar words used in the patent specification and claims of the present invention do not denote any order, quantity or importance, but are merely intended to distinguish between different constituents. Similarly, the terms "one", "a", and similar words are not meant to be limiting, but rather denote the presence of at least one. "Comprising", "consisting", and similar words mean that elements or articles appearing before "comprising" or "consisting" include the elements or articles and their equivalent elements appearing behind "comprising" or "consisting", not excluding any other elements or articles. "Connected", "coupled" and similar words are not restricted to physical or mechanical connections, but may also include electrical connections, whether direct or indirect.

The fan life prediction system of the lamp of the present application can be applied to various high-power illumination lamps with a heat dissipation fan, including but not limited to light-emitting diode (LED) lamps, organic light-emitting diode (OLED) lamps, fluorescent lamps, and high-intensity discharge (HID) lamps. A detailed description will be provided below by using an LED lamp as an example.

Figure 1:
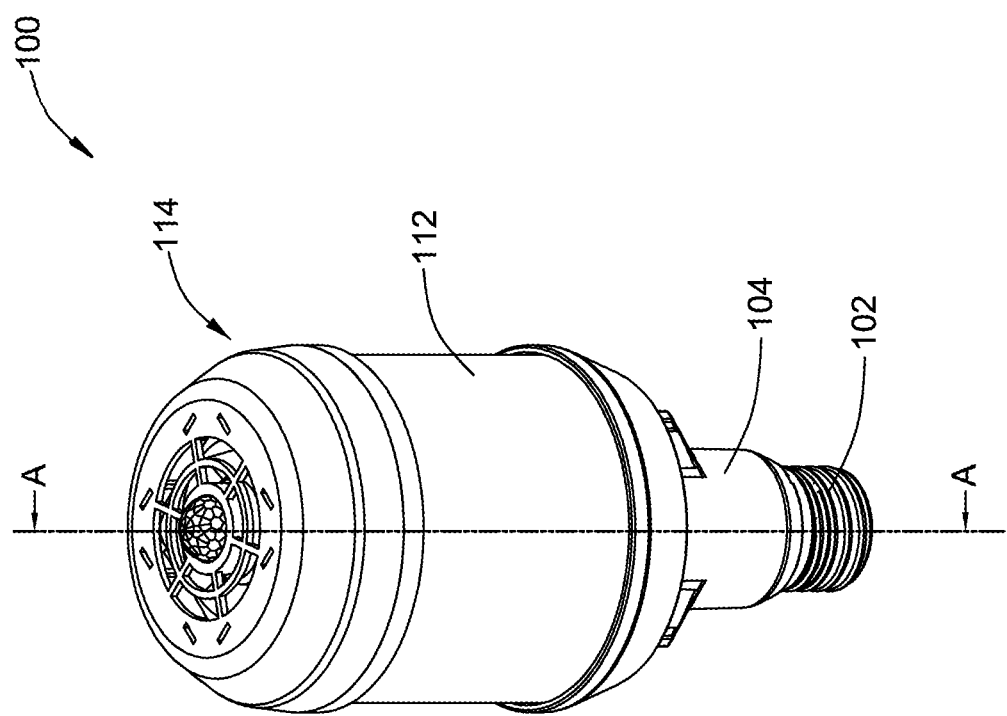
FIG. 1 is a perspective view of a lamp according to an embodiment of the present invention.
Figure 2:
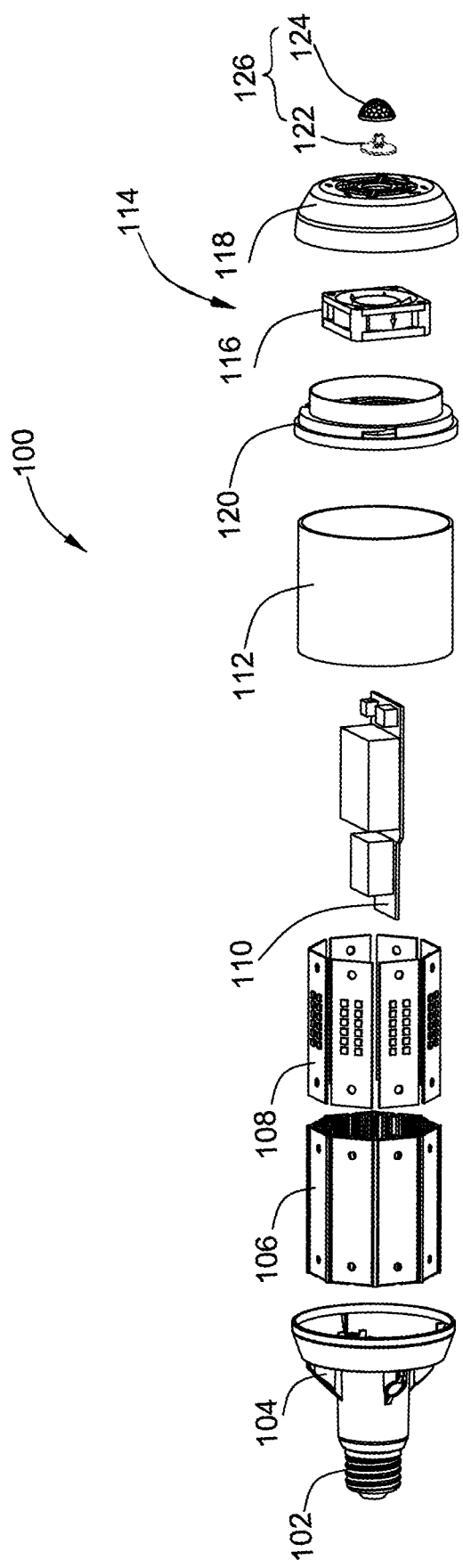
FIG. 2 is an exploded view of the lamp of FIG. 1.
Figure 3:
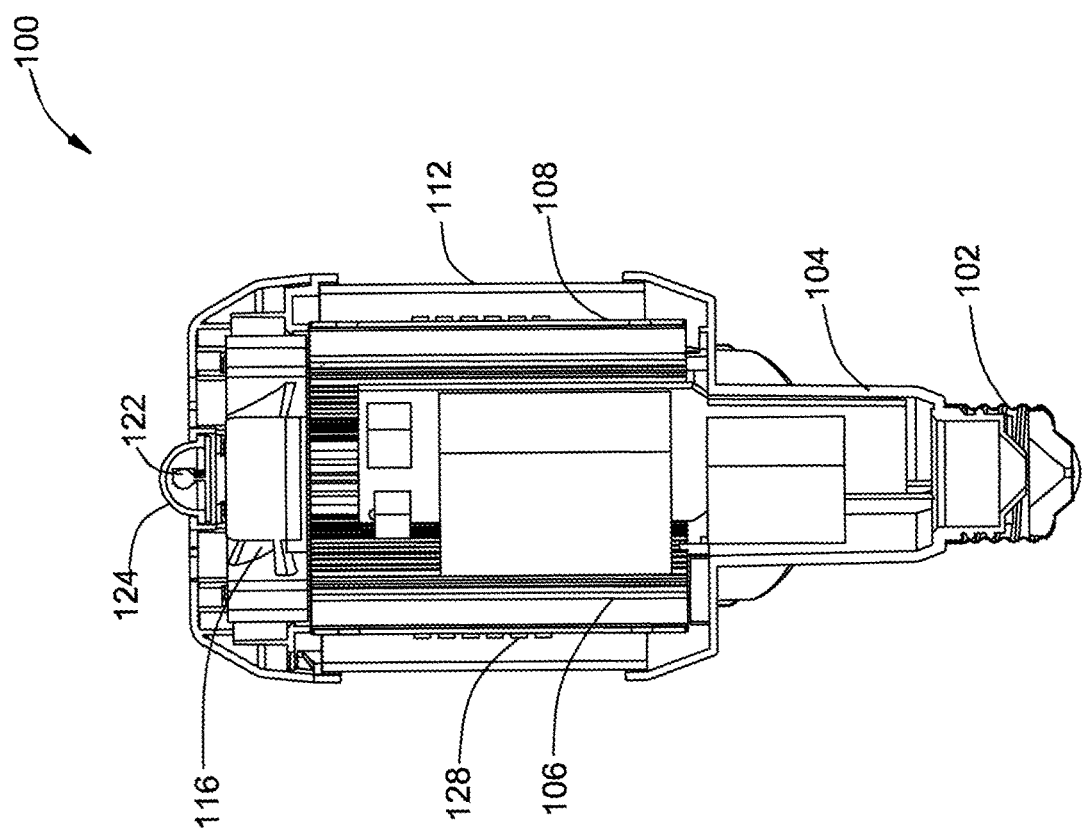
FIG. 3 is a cross-sectional view of the lamp of FIG. 1 taken along line A-A.

FIG. 1 is a perspective view of a lamp 100 of an embodiment. FIG. 2 is an exploded view of the lamp 100 of FIG. 1. FIG. 3 is a cross-sectional view of the lamp 100 of FIG. 1 taken along line A-A.

As shown in FIGS. 1, 2, and 3, the lamp 100 comprises a base 102, a base housing 104, a heat dissipation module 106, at least one printed circuit board 108, a driving module 110, a lamp housing 112, and a fan module 114. The fan module 114 comprises a fan 116 and a cover 118. In some embodiments, to facilitate disassembly and assembly of the fan 116, the lamp 100 further comprises a connection device 120 that is detachably coupled to the cover 118. The base 102 is mounted in a conventional lamp holder or socket and is electrically connected to an external power source. One end of the base housing 104 and the base 102 coupled through a threaded connection, and the other end is used to connect and secure the heat dissipation module 106, the printed circuit board 108, the driving module 110, and the lamp housing 112. Wherein, the driving module 110 is electrically connected to the base 102 and the printed circuit board 108 for driving at least one light emitting diode 128 on the printed circuit board 108. The heat dissipation module 106 is fixed between the base housing 104 and the connecting device 120 with a screw, clip, or adhesive. At least one printed circuit board 108 is mounted around the periphery of the heat dissipation module 106, the heat dissipation module 106 is in thermal contact with the light emitting diodes 128 through the printed circuit board 108 for dissipating heat generated by the light emitting diodes 128.

In some embodiments, as shown in FIGS. 2 and 3, the lamp 100 further comprises a communication module 126 that is secured to the cover 118 and a top cover 124 that protects the communication module 126. The communication module 126 is selected from at least one of a microwave communication module, a Bluetooth communication module, a Wi-Fi communication module, a mobile communication module, a universal packet wireless service technology communication module and a ZigBee communication module. In some embodiments, the top cover 124 also covers a sensor (not shown) secured to the cover 118, wherein the sensor comprises at least one of a daylight sensor, a motion sensor, a human body sensor, an audio sensor, a temperature sensor, a humidity sensor, and an air quality sensor.

Figure 4:
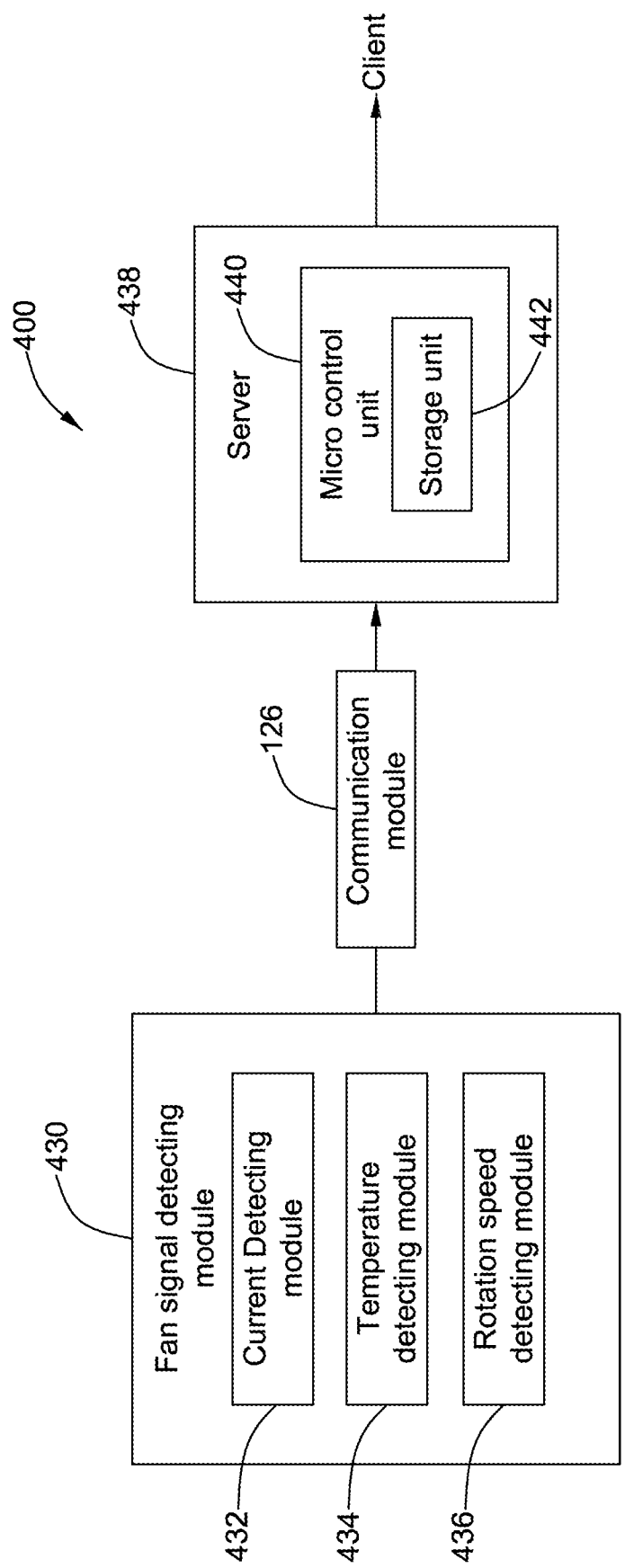
FIG. 4 is a functional block diagram of a life prediction system for a fan of a lamp according to an embodiment of the present invention.

FIG. 4 is a functional block diagram of life prediction system 400 for a fan of a lamp of one embodiment. The life prediction system 400 for a fan of the lamp comprises a fan signal detecting module 430, a communication module 126, and a server 438. The fan signal detecting module 430 comprises a current detecting unit 432, a temperature detecting unit 434, and a rotation speed detecting unit 436. The server 438 comprises a micro control unit 440 that comprises a storage unit 442 for storing a life model of the fan. After confirming the model of the fan, based on the cycle life data of that model under different working conditions, through modeling simulation and calculation analysis, the life model for this particular model of the fan is then established. In the life model of the present embodiment, the predicted residual life of the fan and the working current of the fan, the ambient temperature at which the fan operates, and the rotational speed of the fan are related, that is, LIFE=f(T, I, RPM), wherein LIFE is a prediction of the residual life of the fan, T is the working temperature of the fan, I is the working current of the fan, and RPM is the working rotational speed of the fan. According to the life model, the predicted life of the fan under different working conditions can be calculated more accurately, which can be sent to the customer to provide a reference for the optimal fan replacement strategy.

In some embodiments, the fan is a ball bearing type, and the life model of the ball bearing fan can be calculated using the following formula:

$$\text{LIFE} = a * e^{\frac{b}{T+273.15}} * \frac{2^{-I^2}}{RPM}$$

Wherein, LIFE: the predicted residual life of the fan, the unit is hour; T: the working temperature of the fan, the unit is ° C.; I: the working current of the fan, the unit is A; RPM: the working rotational speed of the fan, the unit is rpm; b is a constant, and in one embodiment, a=411, b=4,421.5. In other embodiments, the values of a and b can be adjusted depending on the fan model and/or working conditions.

In some embodiments, the fan is of the brush type and its life model can also be established by modeling simulation and computational analysis.

Please continue to refer to FIGS. 2 and 4, where:

The current detecting unit 432 is disposed inside the power circuit of the fan 116 for detecting the working current of the fan 116 and converting the detected current into a working current signal output. In some embodiments, the current detecting unit 432 is mounted on the driving module 110 and is electrically connected by a wire to the fan 116. In some embodiments, the current detecting unit 432 mounted on the driving module 110 can be directly coupled to the power supply circuit of the fan 116 on the driving module 110.

The temperature detecting unit 434 is disposed at the air inlet or the air outlet of the fan 116 for detecting the ambient temperature at which the fan 116 operates, and converting the detected ambient temperature into an ambient temperature signal output. The temperature detecting unit 434 is selected from a thermal resistor, a thermistor, a thermocouple, and an integrated temperature sensor, wherein the thermistor comprises a negative temperature coefficient (NTC) thermistor and a positive temperature coefficient (PTC) thermistor. In some embodiments, the current detecting unit 432 is mounted on the printed circuit board 108 at the air inlet of the fan 116 at an end near the fan 116. In some embodiments, the current detecting unit 432 is mounted on the driving module 110 at the air outlet of the fan 116 at an end near the fan 116.

The rotation speed detecting unit 436 is for detecting and outputting the working rotational speed signal of the fan 116. The rotational speed detecting unit 436 obtains a working rotational speed signal of the fan 116 by using an infrared or visible electromagnetic wave signal emitted from the transmitter to be received by the receiver through reflection. In some embodiments, the rotational speed detecting unit 436 is mounted on the driving module 110 at an end near the fan 116. In some embodiments, the rotational speed detecting unit 436 is mounted on the heat dissipation module 106 at an end near the fan 116.

The communication module 126 is coupled to the fan signal detecting module 430 for receiving and transmitting the working current signal, the ambient temperature signal, and the working rotational speed signal to the micro control unit 440 in the server 438 by way of wireless transmission. The micro control unit 440 and lamp 100 are separately disposed, and in some embodiments, the micro control unit 440 is far away from the lamp 100. The communication module 126 is secured to the cover 118 of the lamp 100. In other embodiments, the communication module can be mounted elsewhere on the lamp 100, such as on the outside of the base housing 104.

The micro control unit 440 receives the working current signal, the ambient temperature signal, and the working rotational speed signal of the fan 116 from the communication module 126, and calculates the predicted residual life of the fan 116 by using the life model of the fan 116, and then transmits the calculated predicted residual life to the server 438.

The server 438 is configured to receive the predicted residual life calculated by the micro control unit 440 and then transmit the predicted residual life to the client. The server 438 transmits the predicted residual life of fan 116 to the client over a wired network, wireless network, or other microwave signals. The client can be a variety of PCs (personal computers) or handheld electronic devices. In some embodiments, the server is configured to transmit the current predicted residual life and fan replacement signal to the client when the predicted residual life of the fan 116 is less than or equal to the set lifetime threshold. The lifetime threshold may be configured or adjusted by the user on the client according to different applications and conditions.

Figure 5:
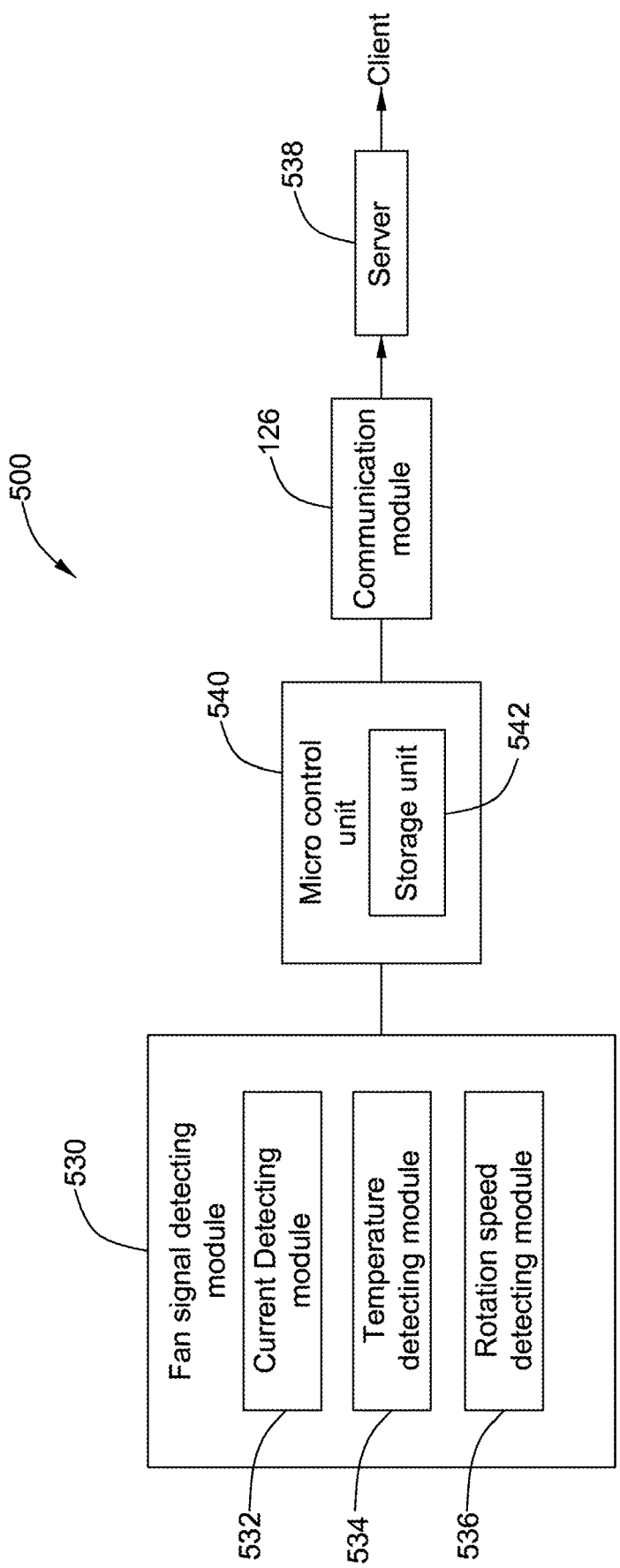
FIG. 5 is a functional block diagram of a life prediction system for a fan of a lamp according to another embodiment of the present invention.

FIG. 5 is a functional block diagram of a fan life prediction system 500 for a lamp of another embodiment. The fan life prediction system 500 of the lamp comprises a fan signal detecting module 530, a micro control unit 540, a communication module 126, and a repeater 538. The fan signal detecting module 530 comprises a current detecting unit 532, a temperature detecting unit 534, and a rotation speed detecting unit 536. The micro control unit 540 comprises a storage unit 542 for storing a life model of the fan.

Please continue to refer to FIGS. 2 and 5, where:

The functions and positions of the current detecting unit 532, the temperature detecting unit 534, and the rotational speed detecting unit 536 are substantially identical to those of the current detecting unit 432, the temperature detecting unit 434, and the rotational speed detecting unit 436 in the embodiment of FIG. 4, and the description thereof will not be repeated here.

The micro control unit 540 receives the working current signal, the ambient temperature signal and the working rotational speed signal of the fan 116 from the current detecting unit 532, the temperature detecting unit 534, and the rotational speed detecting unit 536, and obtain the predicted residual life of the fan 116 calculated by using the life model of the fan 116, and then the calculated predicted residual life is transmitted to the communication module 126. Wherein, the micro control unit 540 and the lamp 100 are integrated. In some embodiments, the micro control unit 540 can be mounted on the driving module 110. In some embodiments, the micro control unit 540 can also be mounted to the cover 118 at a location adjacent to the communication module 126.

The communication module 126 is coupled to the micro control unit 540 for receiving and transmitting the calculated predicted residual life of the fan 116 to the client by way of wireless transmission. The communication module 126 is secured to the cover 118 of the lamp 100. In some embodiments, between a communication module 126 and the client further comprises a repeater 538, the repeater 538 receives the predicted residual life signal of the fan 116 transmitted from the communication module 126, which is retransmitted to the client, thereby achieving a higher data rate and output transmission over longer distances.

Figure 6:
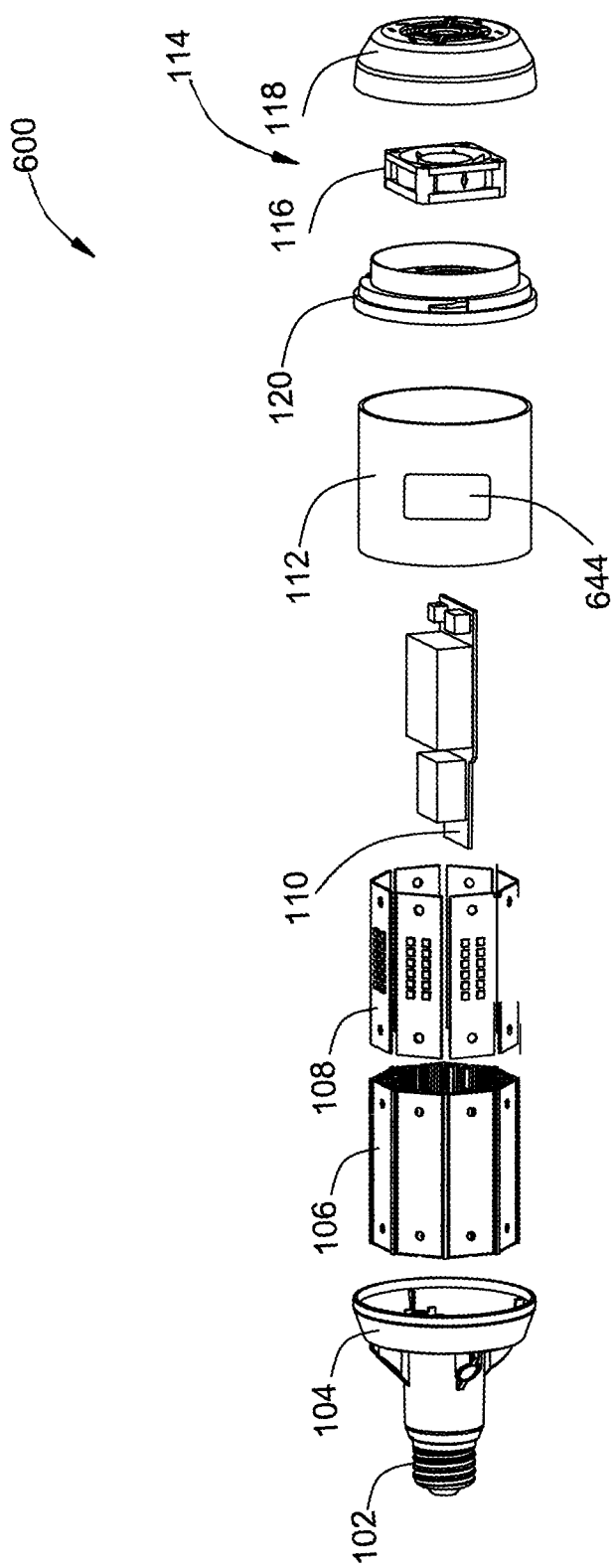
FIG. 6 is an exploded view of a lamp according to another embodiment of the present invention.

FIG. 6 shows an exploded view of a lamp 600 of another embodiment. The lamp 600 comprises a base 602, a base housing 604, a heat dissipation module 616, at least one printed circuit board 608, a driving module 610, a lamp cover 612, and a fan module 614. A display module 644 is mounted onto the lamp cover 612.

Figure 7:
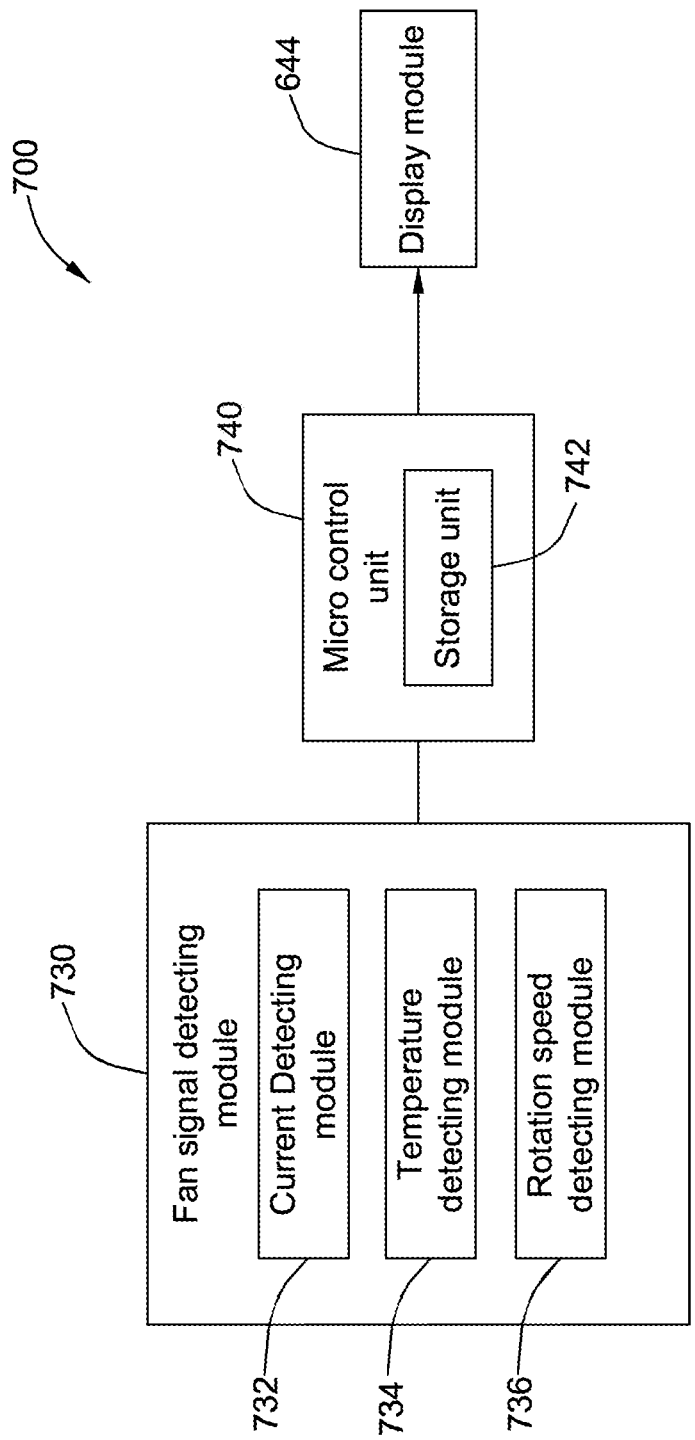
FIG. 7 is a functional block diagram of a life prediction system for a fan of a lamp according to still another embodiment of the present invention.

FIG. 7 is a functional block diagram of a fan life prediction system 700 for a lamp of still another embodiment, comprising a fan signal detecting module 730, a micro control unit 740, and a display module 644. The fan signal detecting module 730 comprises a current detecting unit 732, a temperature detecting unit 734, and a rotation speed detecting unit 736. The micro control unit 740 comprises a storage unit 742 for storing a life model of the fan.

Please continue to refer to FIGS. 6 and 7, where:

The functions and positions of the current detecting unit 732, the temperature detecting unit 734, and the rotational speed detecting unit 736 are substantially identical to those of the current detecting unit 532, the temperature detecting unit 534, and the rotational speed detecting unit 536 in the embodiment of FIG. 5, and the description thereof will not be repeated here.

The micro control unit 740 receives the working current signal, the ambient temperature signal and the working rotational speed signal of the fan 116 from the current detecting unit 732, the temperature detecting unit 734, and the rotational speed detecting unit 736, and obtain the predicted residual life of the fan 116 calculated by using the life model of the fan 116, and then the calculated predicted residual life is transmitted to the display module 644. In some embodiments, the micro control unit 740 is integrated with the lamp 600.

The display module 644 is coupled to the micro control unit 740 for receiving and displaying the predicted residual life calculated by the micro control unit 740. The technician can be made clearly and intuitively aware of the predicted residual life of the fan 616 in order to determine when to replace the fan 616.

Figure 8:
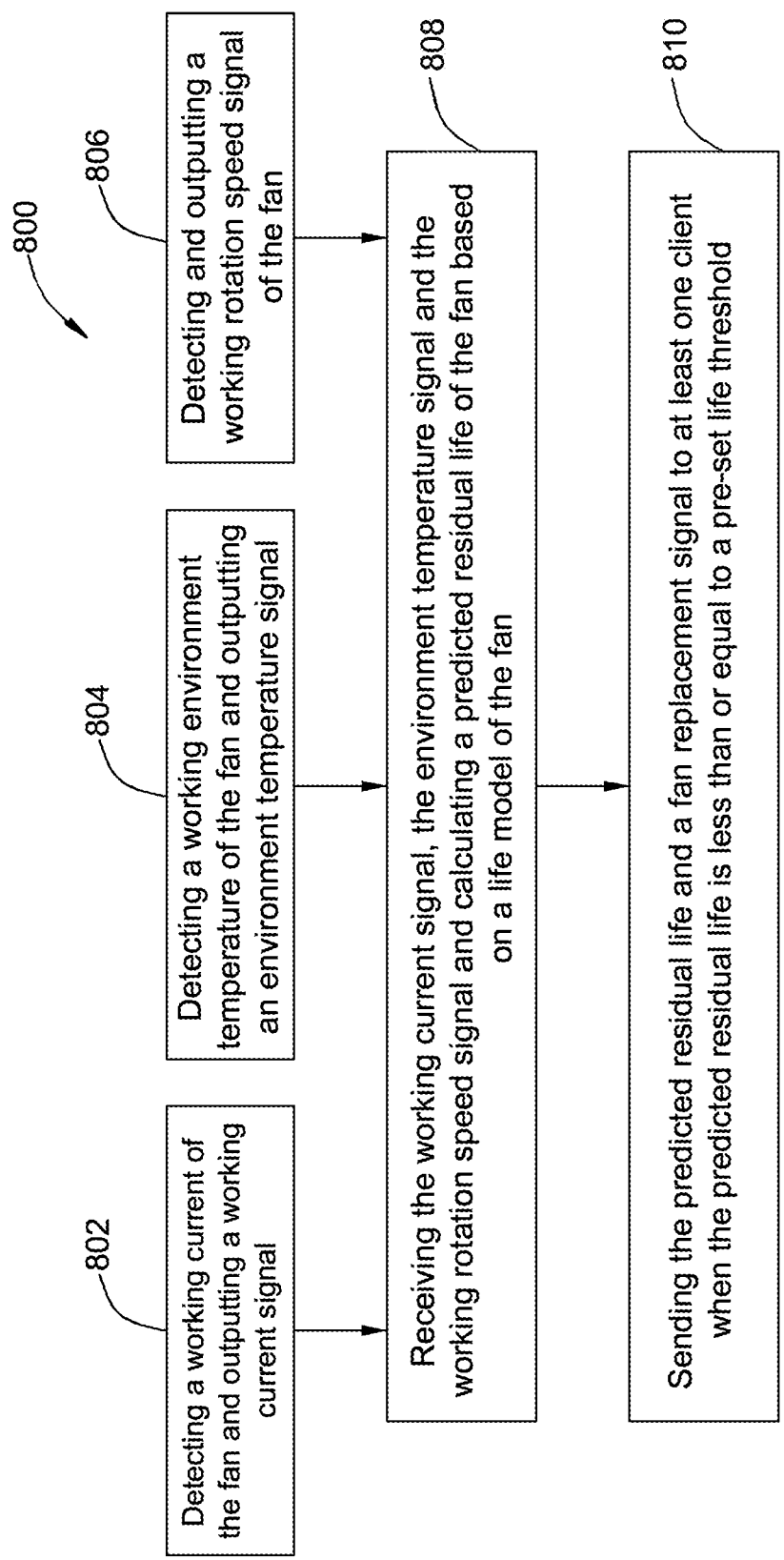
FIG. 8 is a flow chart showing a method for predicting the life of a fan of a lamp according to an embodiment of the present invention.

Please refer to FIG. 8, which is a flowchart of a method 800 for predicting the life of the fan 116 of the lamp of one embodiment. The method 800 comprises the following steps:

Step 802, detecting a working current of the fan 116 and outputting a working current signal.

Step 804, detecting an ambient temperature at which the fan 116 operates, and outputting an ambient temperature signal.

Step 806, detecting and outputting the working rotational speed signal of the fan 116.

Step 808, receiving a working current signal, an ambient temperature signal, and a working rotational speed signal of the fan 116, and calculating a predicted residual life of the fan 116 according to the stored life model of the fan 116.

Step 810, setting a fan life threshold, and transmitting a predicted residual life and a fan replacement signal to the client when the predicted residual life of the fan 116 is less than or equal to the fan life threshold.

In some embodiments, step 808 may comprise the following sub-steps:

Step 8081: Receive a working current signal, an ambient temperature signal, and a working rotational speed signal of the fan 116 and transmit the signal to the micro control unit.

Step 8082: Calculate the predicted residual life of the fan 116 according to the received working current signal of the fan 116, the ambient temperature signal, and the working rotational speed signal and the stored life model of the fan 116.

In some embodiments, step 810 may comprise the following sub-steps:

Step 8101: Receive the predicted residual life of the fan 116, transmit the predicted residual life to the client, or display the predicted residual life through the display module.

Step 8102: When the predicted residual life of the fan 116 is less than or equal to the fan life threshold, the predicted residual life and the fan replacement signal are sent to the client.

As can be seen from the above description, the present application calculates the predicted residual life of the fan according to the pre-stored fan life model by using the working current, the ambient temperature and the working rotational speed during the fan operational process, providing a maintenance and replacement strategy for the fan, thereby improving the reliability of the system's operation.

Although the present invention has been described with reference to specific embodiments, persons skilled in the art may understand that many modifications and variations can be made to the present invention. It is, therefore, to be understood that the appended claims are intended to cover all such modifications and variations insofar as they are within the concept and scope of the invention.

The invention claimed is:

1. A life prediction system for a fan of a lamp, comprising:
a fan signal detecting module configured to detect at least one working parameter of the fan, comprising:
a current detecting unit configured to detect a working current of the fan and output a working current signal;
a temperature detecting unit disposed at at least one of an air inlet or an air outlet of the fan, the temperature detecting unit being configured to detect a working environment temperature of the fan and output an environment temperature signal;
a rotation speed detecting unit configured to detect and output a working rotation speed signal of the fan; and
a communication device to transmit the working current signal, the environment temperature signal and the working rotation speed signal of the fan to a micro control unit located remote from the fan signal detecting module, the micro control unit comprising a storage unit configured to store a life model for a particular model of the fan;
wherein the micro control unit is configured to confirm that the fan has the particular model and, responsive to conforming that the fan has the particular model, calculate a predicted residual life of the fan based on the working current signal, the environment temperature signal, the working rotation speed signal and the life model for the particular model of the fan, the micro control unit transmitting the predicted residual life value for delivery to at least one client in conjunction with a fan replacement signal when the predicted residual life is less than or equal to a pre-set life threshold.

2. The life prediction system according to claim 1, further comprising a server comprising the micro control unit, wherein the server is configured to send the predicted residual life to at least one client.

3. The life prediction system according to claim 1, wherein the communication module is mounted on the cover of the lamp, and the communication module is selected from at least one of a microwave communication module, a Bluetooth communication module, a Wi-Fi communication module, a Mobile communication module, a Universal packet wireless service technology communication module and a ZigBee communication module.

4. The life prediction system according to claim 1, further comprising a repeater configured to receive the predicted residual life from the micro control unit and send the predicted residual life to the client.

5. The life prediction system according to claim 1, further comprising a display module mounted on the cover of the lamp and configured to display the predicted residual life calculated by the micro control unit.

6. A method for predicting a life for a fan of a lamp, comprising:
receiving, from a client device, a life threshold associated with the fan;
detecting, by a current detecting unit, a working current of the fan and outputting a working current signal;
detecting, by a temperature detecting unit disposed at at least one of an air inlet or an air outlet of the fan, a working environment temperature of the fan and outputting an environment temperature signal;
detecting and outputting, by a rotation speed detecting unit, a working rotation speed signal of the fan;
transmitting the working current signal, the environment temperature signal and the working rotation speed signal to a micro control unit located remote from the current detecting unit, the temperature detecting unit, and the rotation speed detecting unit, wherein the micro control unit is configured to confirm that the fan has the particular model and, responsive to conforming that the fan has the particular model, calculate a predicted residual life of the fan based on a life model of the fan; and
transmitting the predicted residual life and a fan replacement signal to a client device if the predicted residual life is less than or equal to the life threshold.

7. A lamp including a fan, the lamp comprising a fan signal detecting module configured to detect at least one working parameter of the fan, the fan signal detecting module comprising:
- a current detecting unit configured to detect a working current of the fan and output a working current signal;
- a temperature detecting unit disposed at at least one of an air inlet or an air outlet of the fan, the temperature detecting unit being configured to detect a working environment temperature of the fan and output an environment temperature signal;
- a rotation speed detecting unit configured to detect and output a working rotation speed signal of the fan; and
- a communication device to transmit the working current signal, the environment temperature signal and the working rotation speed signal of the fan to a micro control unit located remote from the fan signal detecting module, the micro control unit comprising a storage unit configured to store a life model for a particular model of the fan;
- wherein the micro control unit is configured to confirm that the fan has the particular model and, responsive to conforming that the fan has the particular model, calculate a predicted residual life of the fan based on the working current signal, the environment temperature signal, the working rotation speed signal and the life model for the particular model of the fan, the micro control unit transmitting the predicted residual life value for delivery to at least one client in conjunction with a fan replacement signal when the predicted residual life is less than or equal to a pre-set life threshold.

\* \* \* \* \*